United States Patent [19]

Nakao et al.

[11] Patent Number: 5,141,919

[45] Date of Patent: Aug. 25, 1992

[54] SUPERCONDUCTING DEVICE AND METHOD OF PRODUCING SUPERCONDUCTING THIN FILM

[75] Inventors: Masao Nakao; Ryohkan Yuasa; Hideki Kuwahara, all of Tsukuba; Atsuo Mizukami, Kashiwa; Masaaki Nemoto, Tsukuba, all of Japan

[73] Assignee: Sanyo Electric Co., Ltd., Osaka, Japan

[21] Appl. No.: 325,683

[22] Filed: Mar. 20, 1989

[30] Foreign Application Priority Data

Mar. 25, 1988 [JP] Japan .................................. 63-72390
Nov. 17, 1988 [JP] Japan .................................. 63-291436

[51] Int. Cl.$^5$ ............................................. B32B 9/00
[52] U.S. Cl. ........................................ 505/1; 505/701; 505/702; 505/703; 505/704; 428/426; 428/432; 428/433; 428/688; 428/930
[58] Field of Search ............................ 505/1, 701-704; 428/426, 432, 433, 688, 930

[56] References Cited

U.S. PATENT DOCUMENTS 4,939,119  7/1990  Iwata et al. ............................. 505/1

OTHER PUBLICATIONS

Bulk Superconductivity at 120° K. in the Tl-Ca/-Ba-Cu-O System by Z. Z. Sheng and A. M. Hermann Nature, vol. 332 Mar. 10, 1988 at pp. 138-139.
Science, vol. 241, Sep. 1988, pp. 1198FF, Halder et al.
Nature, vol. 332, Mar. 31, 1988, pp. 420ff, Subramanian et al.
Technical Applications of Superconductivity . . . –Bogner, Organ of the Haus der Technik e.V., Essen, FRG, Issue 8, Sep.–Oct. 1987.
Phys. Rev. Letts., vol. 60, No. 16, Apr. 18, 1988, pp. 1657 and 1660.
Phys. Rev. Letters, vol. 61, No. 6, Aug. 8, 1988, pp. 750–753.
Applied Physics Letts., vol. 53, No. 15, Oct. 10, 1988, pp. 1434–1436.
Nature, vol. 332, No. 6159, Mar. 3, 1988, pp. 55–58.
CA110(2):14979g, Legoves 1988.

Primary Examiner—Patrick J. Ryan
Attorney, Agent, or Firm—Darby & Darby

[57] ABSTRACT

The superconducting device according to the present invention is provided with a superconducting thin film of the Tl-Ba-Ca-Cu oxide deposited on a substrate thereof. Consequently, the device can be produced at a low cost because no rare earth elements are required.

The superconducting thin film according to the present invention is formed by sputtering on substrate from a Tl-Ba-Ca-Cu oxide target by means of the sputtering method, followed by annealing in an oxidizing atmosphere. In this way, according to the present invention, it is possible to produce a superconducting thin film of the Tl-Ba-Ca-Cu oxide in a simple way by using an ordinary sputtering apparatus.

10 Claims, 9 Drawing Sheets

SUPERCONDUCTING DEVICE AND METHOD OF PRODUCING SUPERCONDUCTING THIN FILM

BACKGROUND OF THE INVENTION

1. Field of the Invention

The present invention relates to a superconducting device provided with a superconducting thin film of an oxide, specifically of the Tl-Ba-Ca-Cu oxide, and a method of producing the superconducting thin film.

2. Description of the Prior Art

Recently, it has been discovered that the Tl-Ba-Ca-Cu oxide exhibits a superconductivity at a critical temperature (120 K) higher than the boiling point of liquid nitrogen (77 K), which attracted attentions of the researchers and engineers (41 NATURE VOL. 332 Mar. 10, 1988 pages 138-139). This superconductor prepared from the Tl-Ba-Ca-Cu oxide is advantageous in a high critical (transition) temperature, without any rare earth element.

In a device such as a superconducting transistor, a superconducting quantum interference device (SQUID) or the like, a thin film superconductor is used. Consequently, it is necessary to prepare a thin film of superconductor Tl-Ba-Ca-Cu oxide and produce a superconducting device.

SUMMARY OF THE INVENTION

The present invention has been achieved in such a circumstance. The superconducting device according to the present invention is provided with a superconducting thin film of the Tl-Ba-Ca-Cu oxide deposited on a substrate thereof.

A first object of the present invention is to provide a superconducting device at a low cost since rare earth elements are not required.

In the method of the present invention, a superconducting thin film is prepared by sputtering on a substrate from a Tl-Ba-Ca-Cu oxide target by means of the sputtering method, followed by annealing in an oxidizing atmosphere.

A second object of the present invention is to provide a method of producing superconducting thin film devices wherein it is possible to produce a superconducting thin film by using an ordinary sputtering apparatus.

A third object of the present invention is to provide a method of producing superconducting thin film devices wherein it is possible to produce superconducting thin film easily in a simple way.

The above and further objects and features of the invention will more fully be apparent from the following detailed description with accompanying drawings.

DESCRIPTION OF THE PREFERRED EMBODIMENTS

The superconducting device according to the present invention has a superconducting thin film of the Tl-Ba-Ca-Cu oxide on a substrate. Here the substrate is a substrate in a superconducting device, or an insulation layer or a buffer layer on an active layer formed on the substrate in a superconducting device. In the superconducting device according to the present invention, no rare earth metals are required. Consequently, the device can be produced at a low cost.

First embodiment

Figure 1:
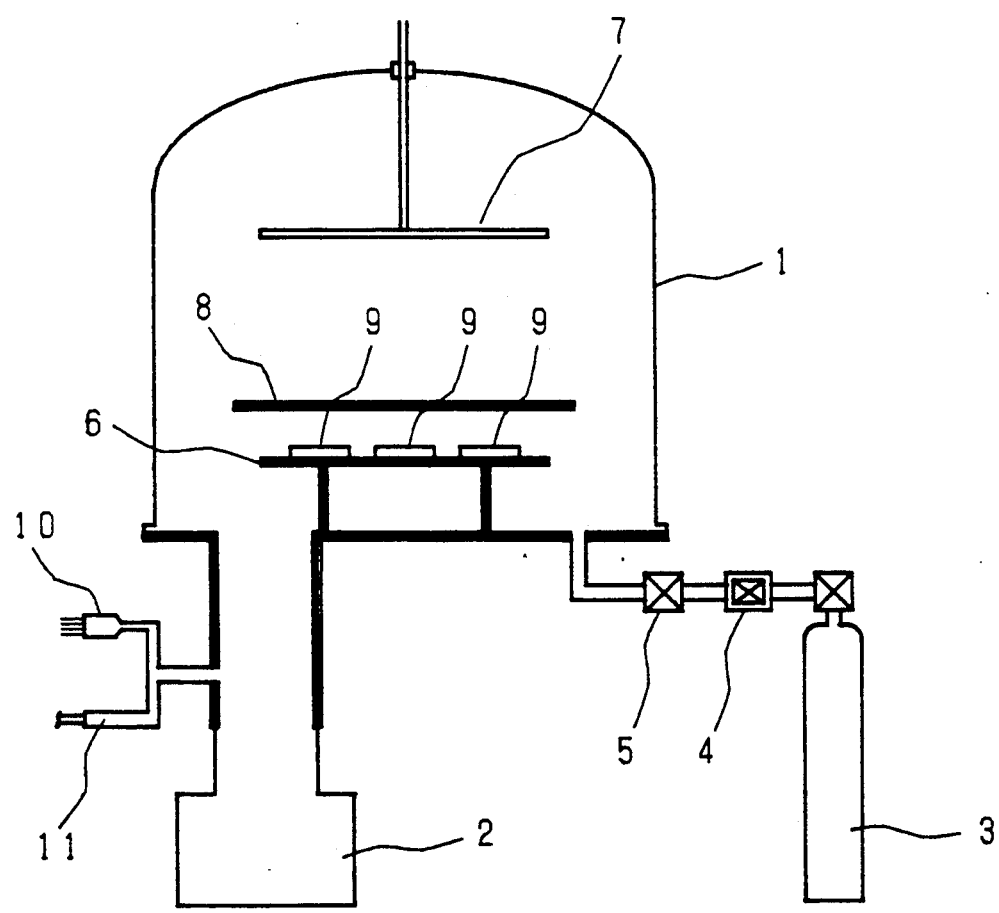
FIG. 1 is a schematic view of a sputtering apparatus used for carrying out the method of producing superconducting thin film according to the present invention.

FIG. 1 shows the structure of a RF (radiofrequency) magnetron sputtering apparatus used in practicing the process of the present invention to make the device thereof, wherein numeral 1 denotes a bell jar of the sputtering apparatus to which an exhaust system 2 is linked. Also linked to the bell jar 1, is an argon gas cylinder 3 for supplying argon gas, that is discharge gas into the bell jar 1, via a variable leak valve 4 and a stop valve 5. In the bell jar 1, an anode 6 and a cathode 7 that are counter electrodes are provided oppositely with a movable shutter 8 between. The anode 6 is grounded, and $SrTiO_3$ substrates 9 are put on the anode 6 for depositing superconducting thin films on the surfaces thereof. The cathode 7 is made of the sintered target of the Tl-Ba-Ca-Cu oxide (with the preparation composition ratio Tl:Ba:Ca:Cu=3:2:2:3), and to the cathode 7 a negative high voltage is applied. Numerals 10 and 11 in the figure denoted a high vacuum gauge and a low vacuum gauge respectively.

This sintered target forming the cathode 7 is made by a solid-state reaction of high-purity reagents. Four kinds of high-purity reagents (34.3 g of $Tl_2O_3$ of a purity of 99.9%, 19.7 g of $BaCO_3$, 10.0 g of $CaCO_3$ and 11.9 g of CuO, of a purity of 99.9%) are added to an organic solvent such as methanol, ethanol or the like, with three parts of Tl, two of Ba, two of Ca and three of Cu, by preparation composition, stirred with a stirrer. Then, after evaporating the organic solvent, the reagents are ground into powder in a mortar. Put in an alumina boat covered with an alumina cap, this powder is calcined in an electric furnace at 930° C. for half an hour. This calcined powder is put into a mold, pressed into a pellet at a pressure of 750 $kgf/cm^2$. Put in an alumina boat covered with an alumina cap, this pellet is then sintered at 925° C. in air for one minute to obtain a 10 cm diameter and 0.5 cm thick sintered $Tl_3Ba_2Ca_2Cu_3O_x$ target.

0.5 to 5 μm thick thin films are prepared on the substrates 9 by supplying argon gas of a purity of 99.9995% with a pressure of 3.0 to 30.0 mTorr from the argon gas cylinder 3 into the bell jar 1, and at the same time by sputtering at a sputtering power of 100 to 250 W. To give an example, the growing rate is 400 Å/min. under a condition where the sputtering power is 120 W, the applying voltage is 2.6 kV and the distance between both electrodes is 3.5 cm, when 1.5 to 3.5 μm thick thin films are prepared on the substrates.

Then, put in an alumina vessel, the substrates 12 9 on which thin films are formed are put in an electric furnace, wherein the temperature is raised from room temperature to 940° C. at a rate of 1° C./sec. in an oxygen atmosphere with a flow rate of 2 l/min. and annealing is carried out at 940° C. for ten minutes, followed by cooling to room temperature at a rate of −20° C./sec. to prepare superconducting thin films of $Tl_3Ba_2Ca_2Cu_3O_x$ on the $SrTiO_3$ substrates 9. Bulk superconductivity at 120 K in the Tl-Ca/Ba-Cu-O system by Z. Z. Sheng and A. M. Herman. In this connection, the above-mentioned temperature is optimum as the annealing temperature.

The cooling condition after annealing, however, does not affect so much in obtaining a superconducting state.

Figure 2:
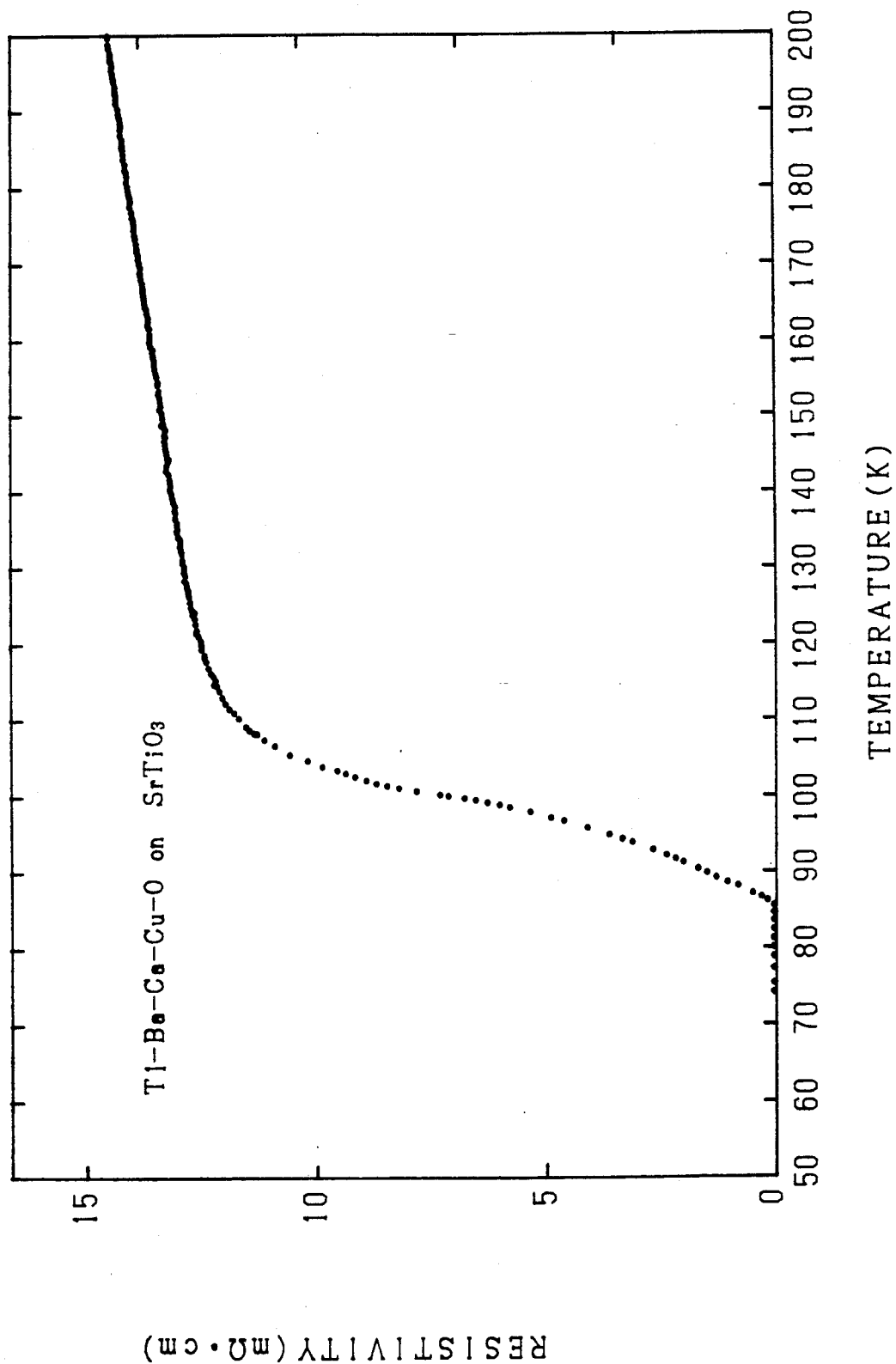
FIGS. 2, 4, 7 and 9 are charts showing temperature dependence of resistivity in a superconducting thin film obtained by the present invention.

FIG. 2 is a chart showing resistivity vs. temperature curve for an obtained superconducting thin film of the Tl-Ba-Ca-Cu oxide. The temperature dependence of the film resistivity is measured by the standard four-probe technique using pressed indium contacts. The temperature is measured by an Au+0.07% Fe-Chromel thermocouple. The applied constant current density ranges from 0.5 Å/cm$^2$ to 5 Å/cm$^2$. The zero-resistivity temperature is 86 K for a film on a substrate, and a resistance anomaly is observed around 110 K, which suggests that a superconducting phase of 110 K class is contained in part of the formed film.

Figure 3:
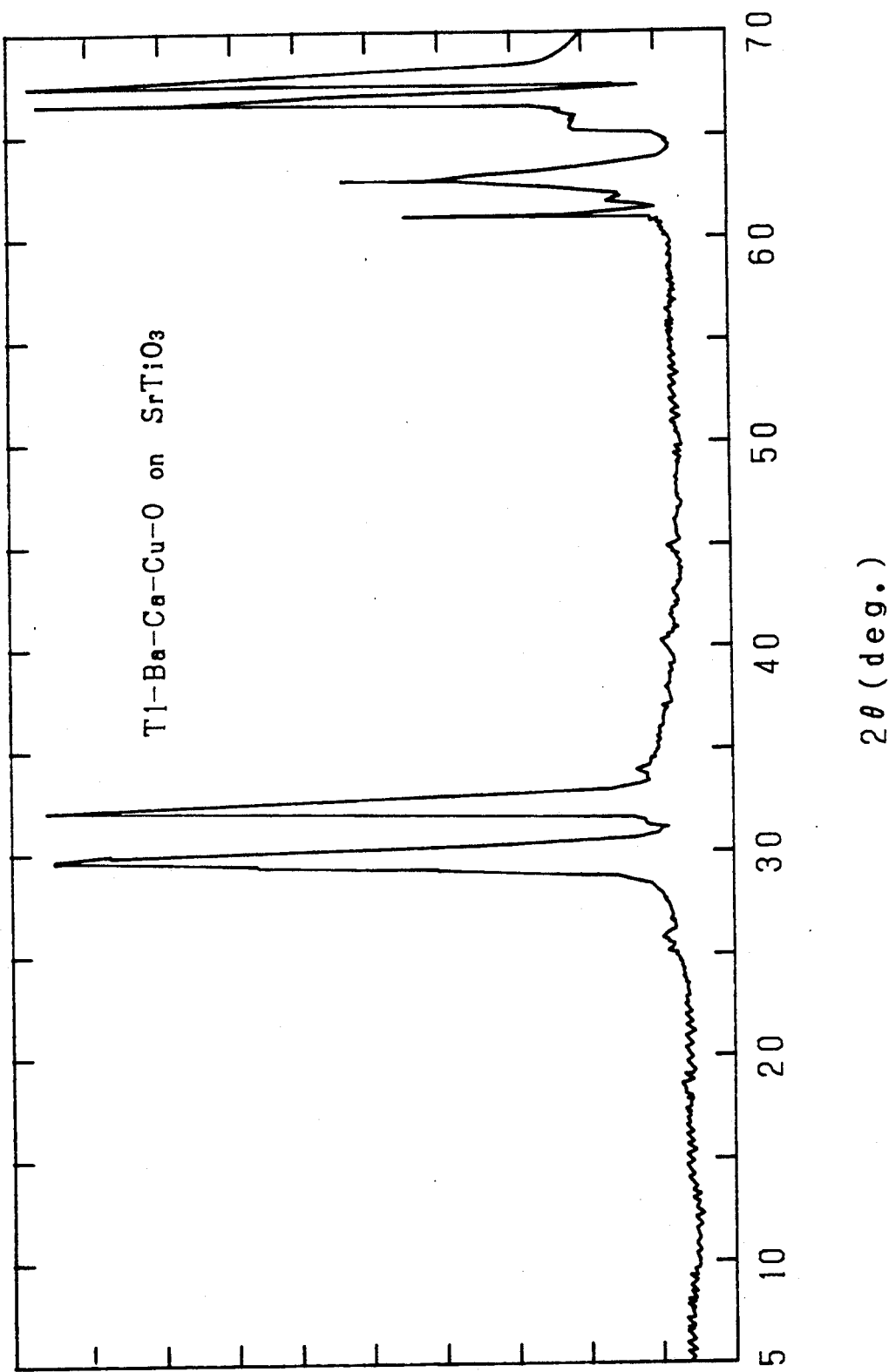
FIGS. 3, 5, 6 and 8 are X-ray diffraction patterns of a superconducting thin film obtained by the present invention.

FIG. 3 shows a X-ray diffraction pattern of a superconducting thin film obtained in this first embodiment.

On the other hand, a Meissner effect in a superconducting thin film obtained in this first embodiment shows that a diamagnetic state begins to be observed from around 110 K and a perfect diamagnetic state is observed at 86 K.

Second embodiment

A second embodiment is a case where (100) MgO substrates are used as substrates 9 in the first embodiment. In this connection, the sputtering condition and the annealing condition in this second embodiment as those in the first embodiment.

Figure 4:
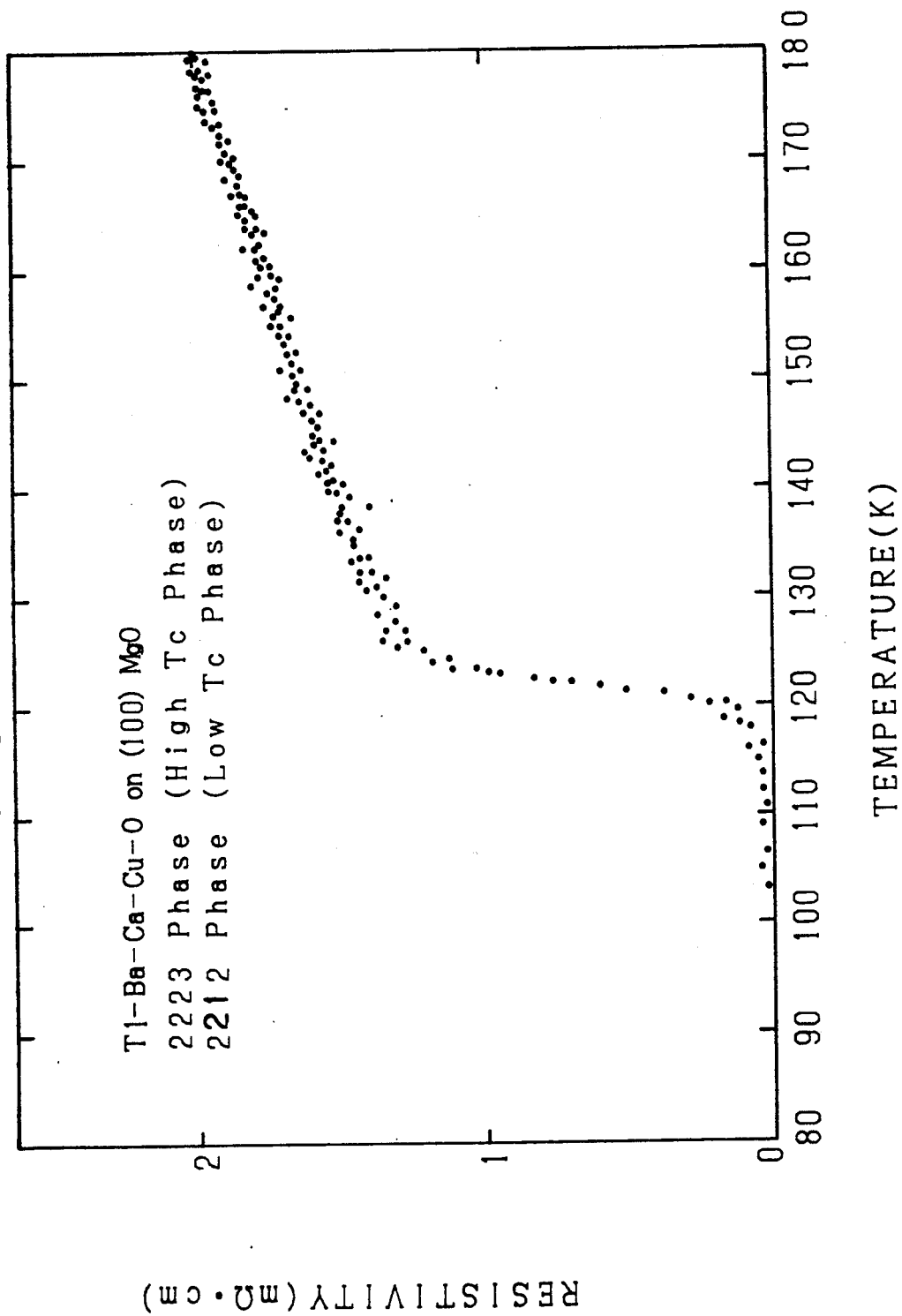
Figure 5:
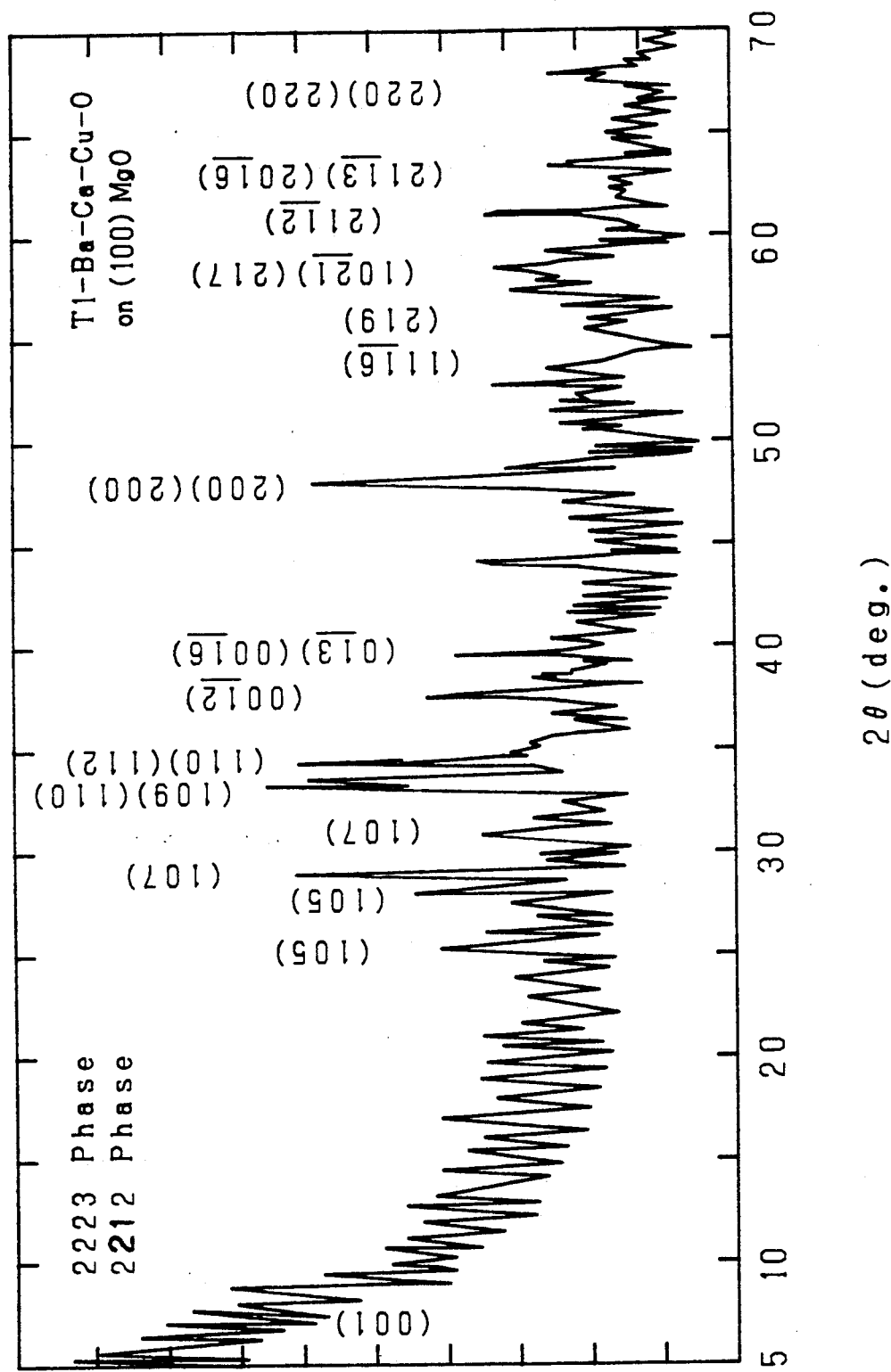

FIG. 4 is a chart showing resistivity vs. temperature curve for a superconducting thin film obtained in the second embodiment, wherein the zero-resistivity temperature is 116 K. FIG. 5 shows a X-ray diffraction pattern of a superconducting thin film obtained in the second embodiment, wherein observed is that both 2223 and 2212 phases are contained in this superconducting thin film. A Meissner effect in a superconducting thin film obtained in the second embodiment shows that a diamagnetic state begins to be observed from around 115 K.

Third embodiment

A third embodiment is a case where a sinter of the Tl-Ba-Ca-Cu oxide is used with one part of Tl, two of Ba, two of Ca and three of Cu, by composition ratio, as the sintered target forming the cathode 7 in the first embodiment.

This sintered target is obtained by the same processes as in the case for obtaining the sintered target in the first embodiment, using four kinds of high-purity reagents (16.3 g of Tl$_2$O$_3$ of a purity of 99.9%, 28.2 g of BaCO$_3$, 14.3 g of CaCO$_3$ and 17.0 g of CuO, of a purity of 99.9%). Prepared are thin films of the same thickness as those prepared in the first embodiment on the substrates 9 under the same condition as in the first embodiment as for the structure of the sputtering apparatus and preparing conditions (the argon gas pressure, the sputtering power etc.), except that the cathode 7 is made of the sintered target of the Tl-Ba-Ca-Cu oxide (with the composition ratio Tl:Ba:Ca:Cu=1:2:2:3) obtained in this way. Then, annealing is carried out under the same condition as in the first embodiment to prepare superconducting thin films of Tl$_1$Ba$_2$Ca$_2$Cu$_3$O$_x$ on the SrTiO$_3$ substrates 9.

Figure 6:
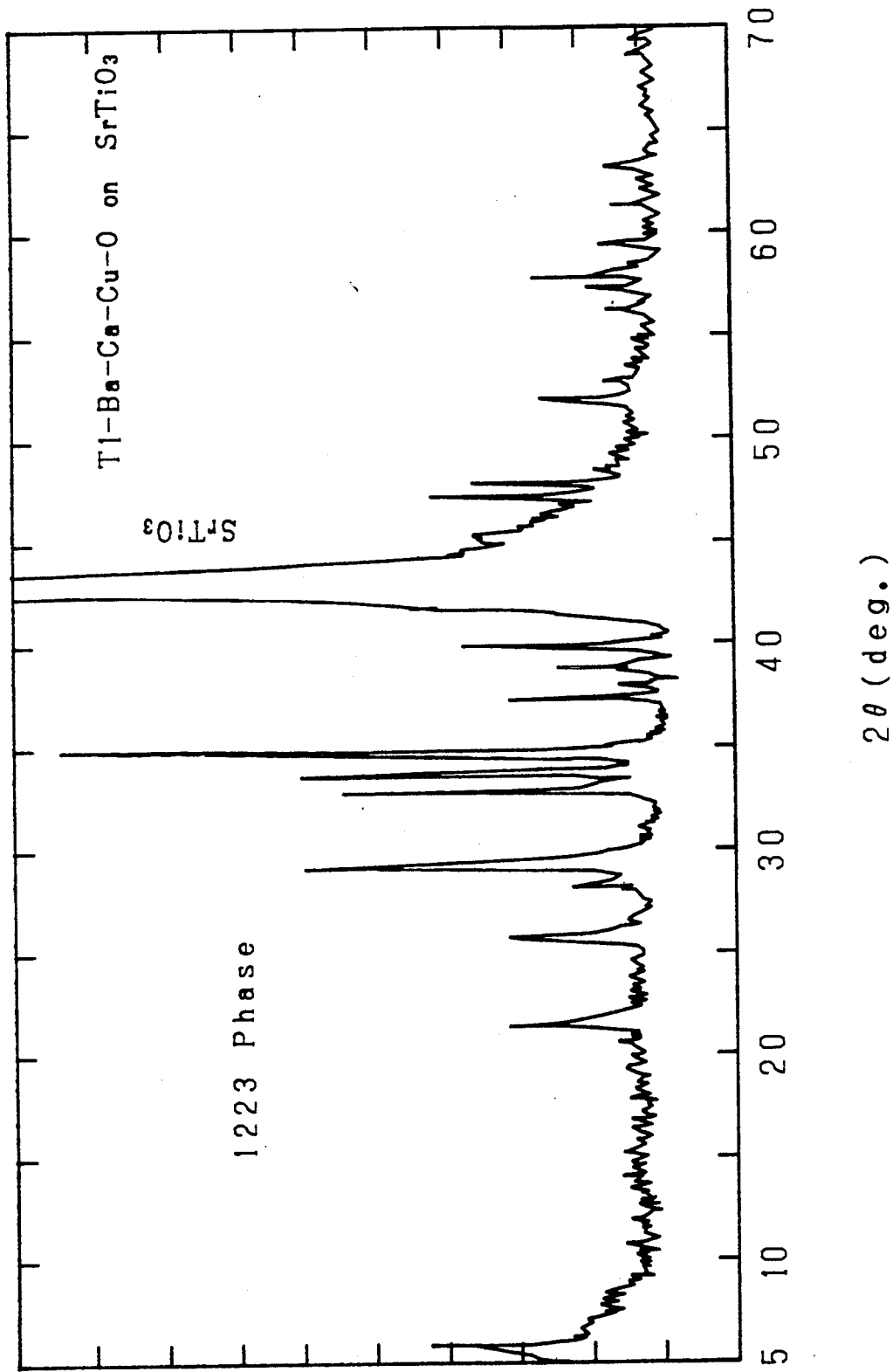
Figure 7:
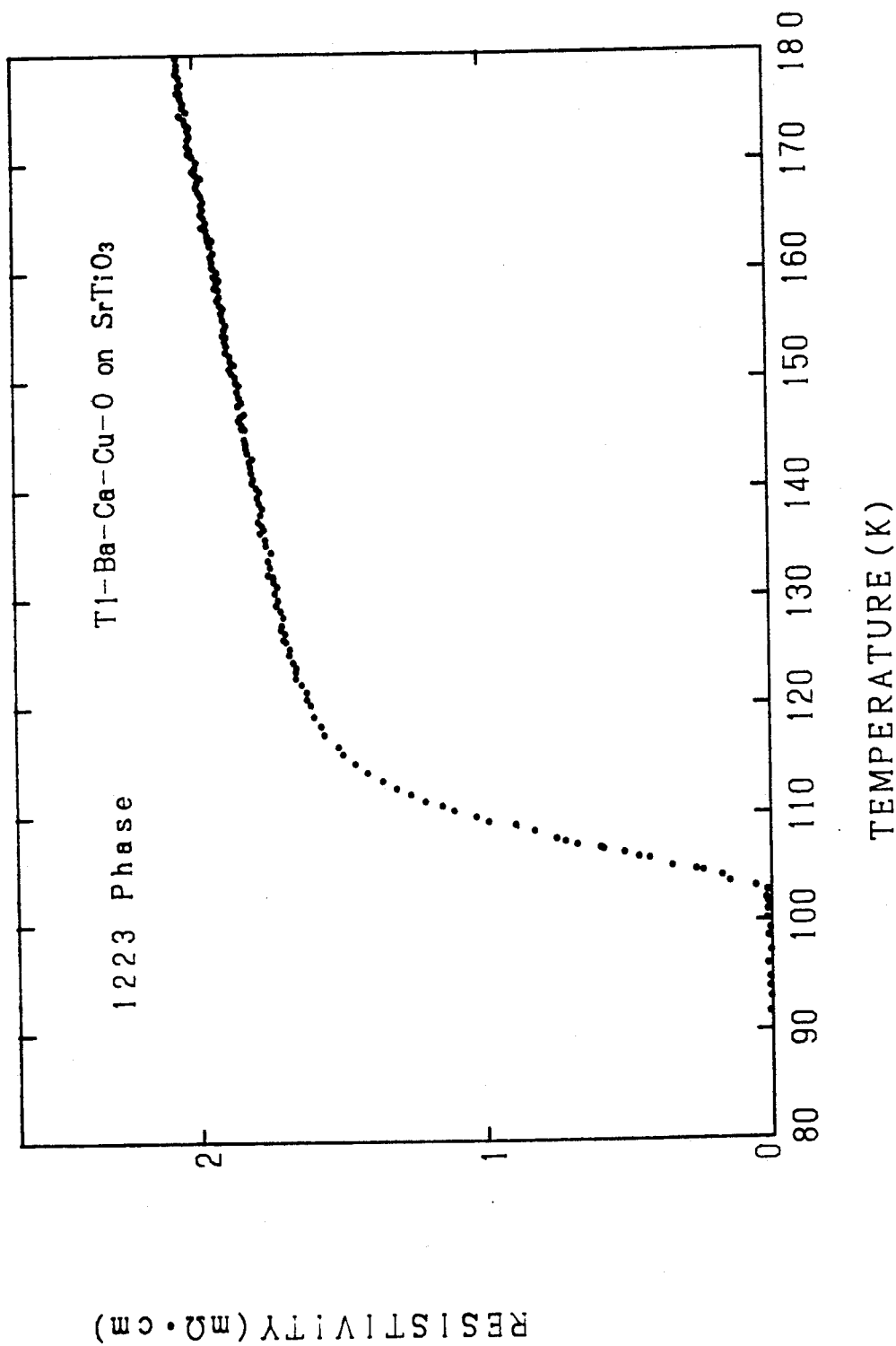

FIG. 6 shows an X-ray diffraction pattern of a superconducting thin film obtained in this third embodiment, wherein shown is that this superconducting thin film is a single phase of Tl$_1$Ba$_2$Ca$_2$Cu$_3$O$_9$ (1223 phase). FIG. 7 is a chart showing resistivity vs. temperature curve for a superconducting thin film obtained in this third embodiment, wherein observed is the zero-resistivity at 103 K.

Fourth embodiment

A fourth embodiment is a case where (100)MgO substrates are used as substrates 9 in the third embodiment. In this connection, the same are the sintered target, the sputtering condition and the annealing condition in this fourth embodiment as those in the third embodiment.

Figure 8:
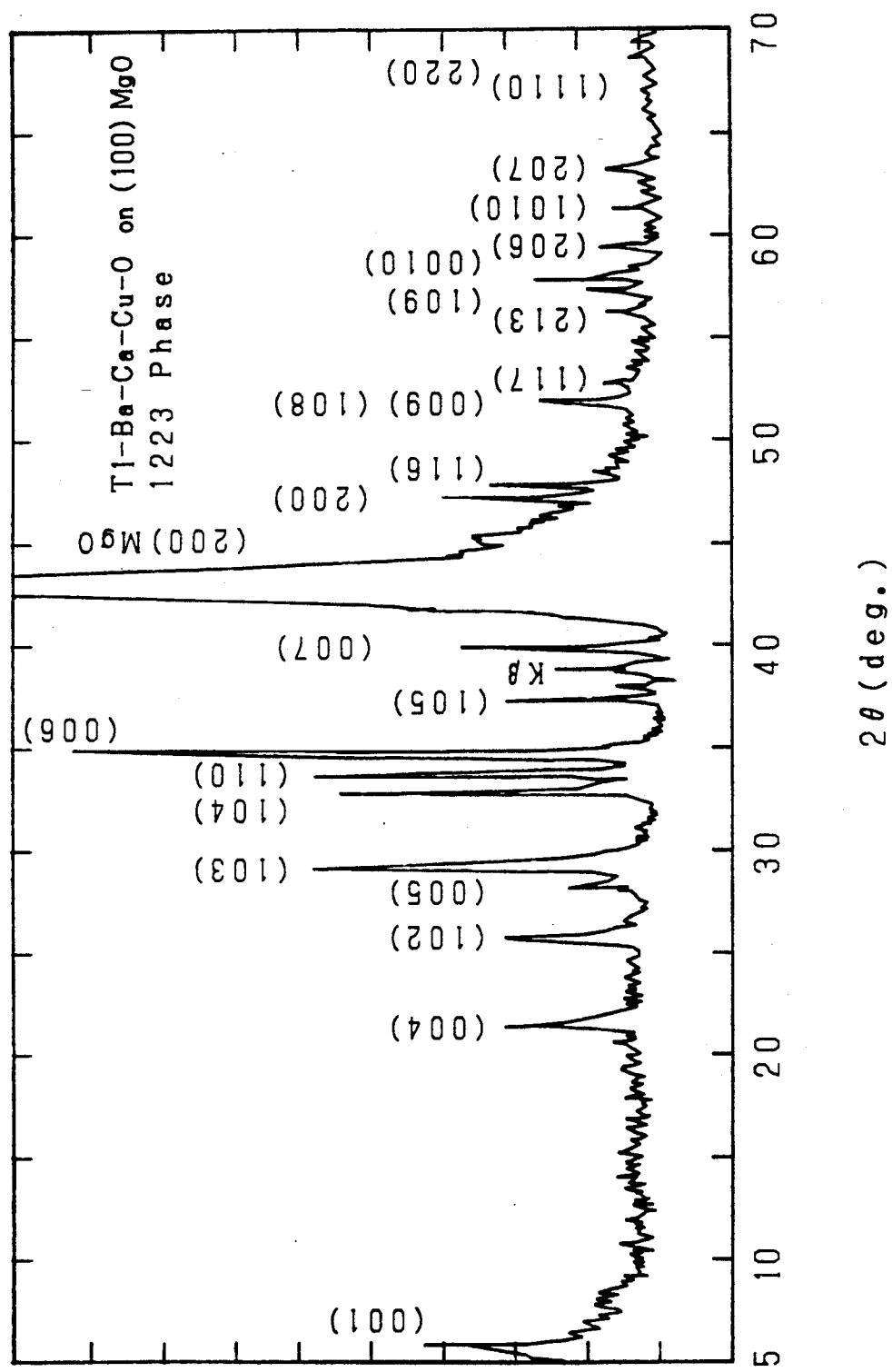
Figure 9:
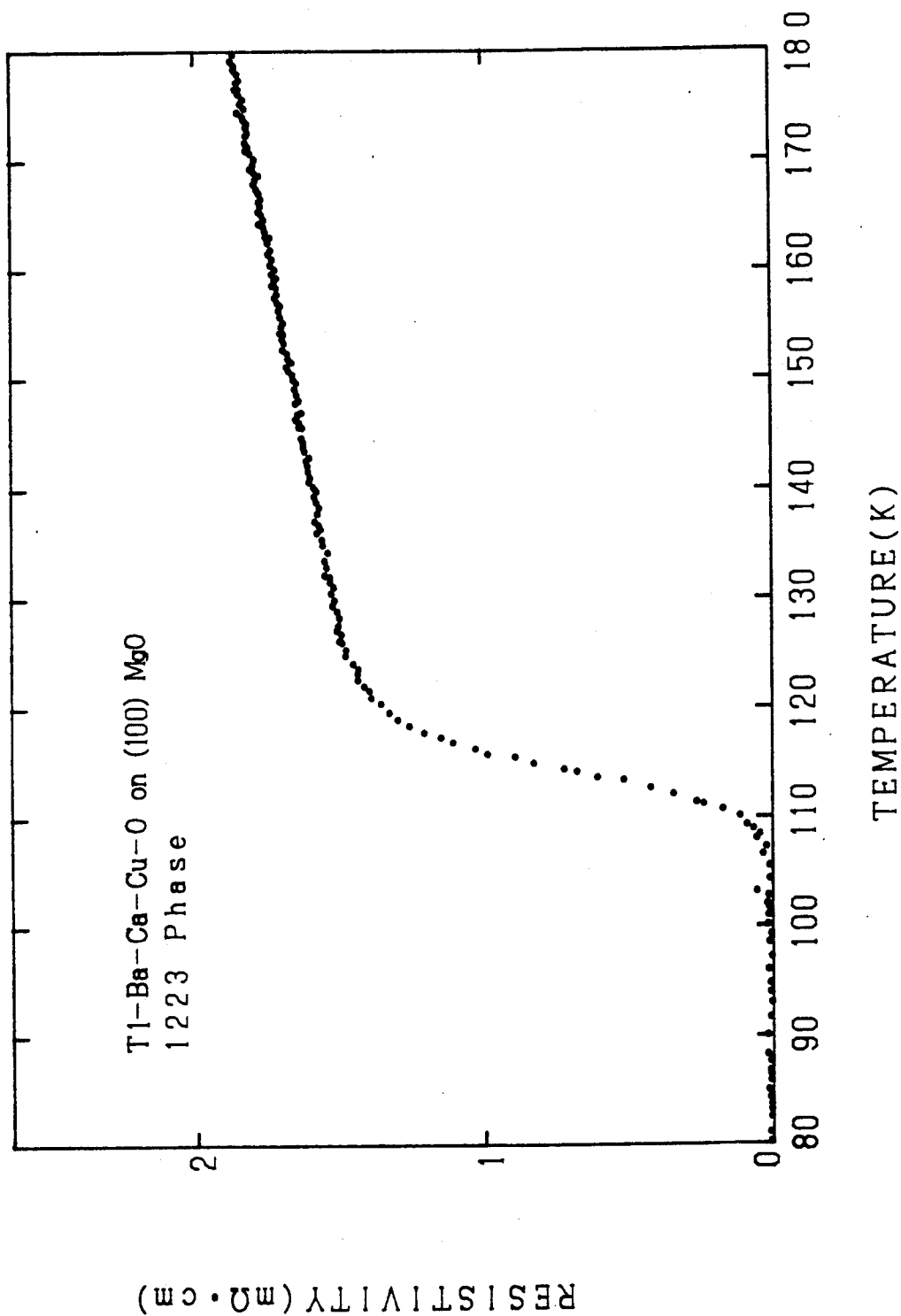

FIG. 8 shows a X-ray diffraction pattern of a superconducting thin film obtained in the fourth embodiment, wherein shown is that this superconducting thin film is a single phase of Tl$_1$Ba$_2$Ca$_2$Cu$_3$O$_9$ (1222 phase). FIG. 9 is a chart showing resistivity vs. temperature curve for a superconducting thin film obtained in the fourth embodiment, wherein observed is the zero-resistivity at 106 K.

In each of the first to fourth embodiments mentioned above, SrTiO$_3$ substrates and MgO substrates are used as substrates. They, however, should not be limited as such. Sapphire substrates and YSZ (yttria-stabilized ZrO$_2$) substrates are usable. It is also possible to use Si substrates coated with BaF$_2$ or CaF$_2$.

Furthermore, in each of the first to fourth embodiments, annealing is carried out in an oxygen atmosphere. It is also possible to carry out annealing in other oxidizing atmosphere.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A superconducting device comprising a superconducting thin film of a Tl-Ba-Ca-Cu oxide sputtered on a substrate from a target of Tl-Ba-Ca-Cu oxide, said sputtered thin film of the Tl-Ba-Ca-Cu oxide selected from the group consisting of oxides of Tl$_2$Ba$_2$Ca$_2$Cu$_3$, Tl$_2$Ba$_2$CaCu$_2$, TlBa$_2$Ca$_2$Cu$_2$, TlBa$_2$Ca$_2$Cu$_3$, and mixtures of at least two of said oxides.

2. A superconducting device as set forth in claim 1, wherein said substrate is SrTiO$_3$ substrate.

3. A superconductivity device comprising a substrate on which is formed by sputtering a superconductive thin film of a Tl$_1$Ba$_2$Ca$_2$Cu$_3$ oxide.

4. A superconducting device as set forth in claim 1, wherein said substrate is MgO substrate.

5. A superconducting device as set forth in claim 3, wherein said substrate is SrTiO$_3$ substrate.

6. A superconducting device as set forth in claim 3, wherein said substrate is MgO substrate.

7. A superconducting device as in claim 1 wherein the target is Tl$_3$Ba$_2$Ca$_2$Cu$_3$ oxide.

8. A superconducting device as in claim 1 wherein the device has been sintered at a higher temperature than the melting point of Tl.

9. A superconducting device as in claim 8 wherein the device has been sintered at a temperature of 940° C. for about 10 minutes.

10. A superconducting device as in claim 3 wherein the thin film was sputtered onto the substrate from a target of a TlBa$_2$Ca$_2$Cu$_3$ oxide.

* * * * *